March 13, 1951 W. P. VAN DEUSEN 2,544,905
METHOD OF MAKING PHOTOGRAPHIC RELIEF IMAGES
Filed Oct. 23, 1948
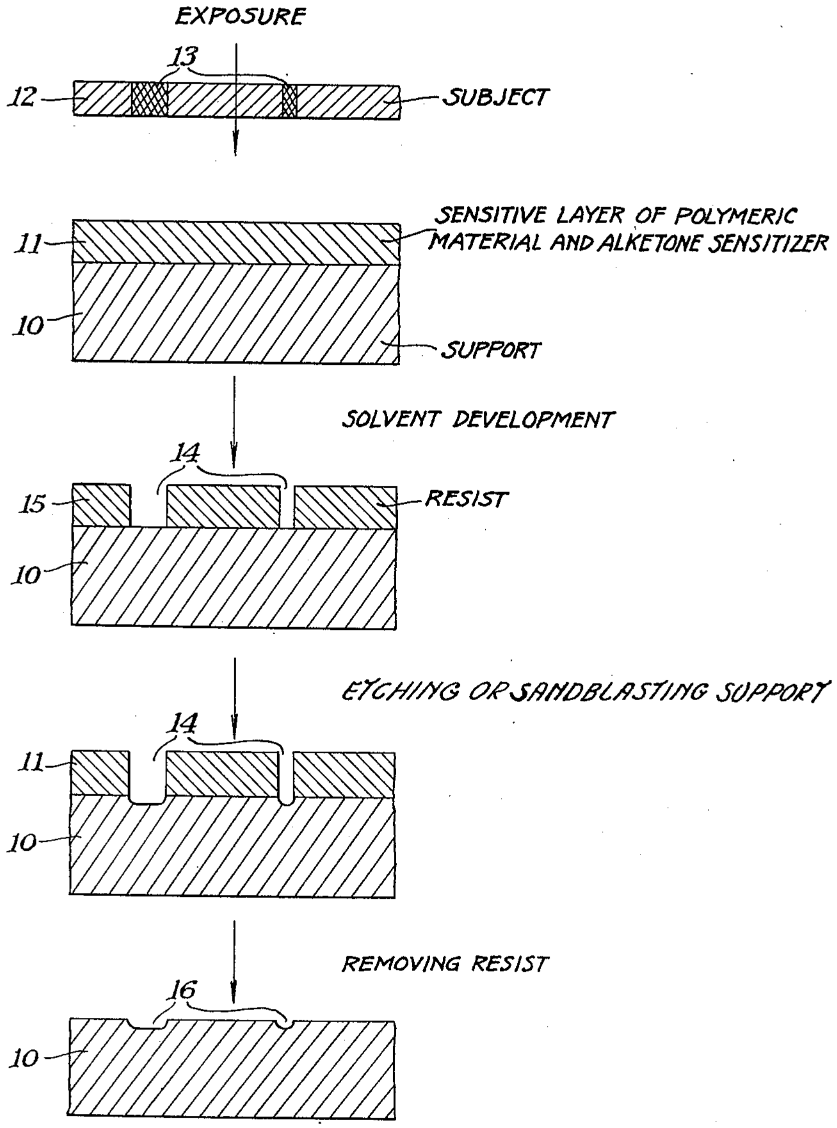
WERTER P. VAN DEUSEN
INVENTOR
BY Newton M. Perrins
W. H. McDowell
ATTORNEY & AGENT Patented Mar. 13, 1951

2,544,905

UNITED STATES PATENT OFFICE 2,544,905

METHOD OF MAKING PHOTOGRAPHIC RELIEF IMAGES

Werter P. Van Deusen, Rochester, N. Y., assignor to Eastman Kodak Company, Rochester, N. Y., a corporation of New Jersey Application October 23, 1948, Serial No. 56,174

8 Claims. (Cl. 95—5.7)

This invention relates to methods of making photographic relief images of particular use in the photomechanical arts.

It is well known in the art of photomechanical reproduction to utilize various materials such as bichromated shellac or glue for forming resist images upon various supports such as metal plates. The support is then etched or otherwise treated in the areas not covered by the resist image and the resultant image, usually after the removal of the resist image, is used for printing. One method of forming relief images on metal supports is disclosed in the Beebe et al. U. S. Patent 1,587,274, granted June 1, 1926, includes coating a metal support with an alketone condensation product resulting from the reaction of, for example, furfural with acetone, which coating is light-sensitive and after exposure under an image is treated with a solvent which removes the coating in the unexposed regions of the support. Subsequently, the support is etched in the regions from which the light-sensitive coating has been removed. A number of alketone compounds have been proposed for such usage, such as monoalketones; for example, benzal acetone, chalcones; for example, cinnamal acetophenone, dialketones;, for example, difurfural acetone and a cyclic dialketone, difurfural cyclohexanone. I have found that such light-sensitive alketone compounds have limited use but when combined with a polymeric material of the type to be described, they furnish resist layers having a wide application in the photomechanical art.

One object of my invention is to provide a method of making photographic relief images by means of alketone light-sensitive resist materials. Another object of my invention is to provide alketone materials which are light-sensitive and adapted to selective development. Other objects of my invention will appear from the following description.

The objects of my invention are accomplished in part by coating a support with a layer of a mixture of certain alketone compounds and a polymeric material such as cellulose ethyl ether or an acrylate resin such as methyl methacrylate resin and after exposure of the layer under a line or halftone image, selectively removing the unexposed area of the layer by means of a hydrocarbon solvent. In addition to the polymeric materials mentioned, cellulose nitrate and polystyrene resin may be used in combination with the alketone compound as well as other acrylate resins such as methyl acrylate, polyvinyl acetates, polyvinyl chloride-acetates, polyvinyl acetals, coumarone-indene resins, rosin modified maleic ester resins, chlorinated paraffins, polyisobutylenes, chlorinated rubbers and urea and phenolic resins. However, cellulose ethyl ether and methyl methacrylate resin represent preferred embodiments of the polymeric materials useful in my invention, since these polymeric materials furnish resist images of the highest definition and provide the best resistance to etching solutions and other treatments applied to etch the bared areas of a photomechanical support.

The alketone compounds forming a part of my invention have the general formula:

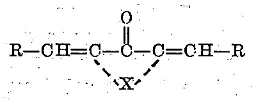

wherein R represents a furfuryl, styryl, or aryl group of the benzene series, X represents the atoms necessary to complete a cyclic ring of five or six carbon atoms. Examples of such compounds falling within the above general formula are the alketone condensates obtained by reaction of cinnamic aldehyde, anisaldehyde or furfuraldehyde with cyclopentanone, p-methylcyclohexanone or cyclohexanone. Of these alketone condensates I have found difurfural cyclopentanone to be most useful and most generally applicable when employed with cellulose ether or a resin to a wide range of photomechanical processes. Accordingly, a composition containing a mixture of difurfural cyclopentanone and cellulose ethyl ether having hydrocarbon solubility, the ether being well etherified to the extent of about 50% ethoxyl, represents compositions from which light-sensitive coatings yielding the best relief images can be obtained. The amount of alketone condensate used in the resist is determined by its solubility in the polymeric constituent in the dry state, and generally 6–12% alketone is satisfactory although this value will vary somewhat with the particular polymeric constituent selected.

The accompanying drawings illustrate in enlarged cross-sectional view, the appearance of materials and the various steps in my process of producing photographic relief images in the manner of my invention.

The following examples are illustrative of my invention and describe it with particular reference to the accompanying drawings:

*Example 1*

The light-sensitive compositions above-described are particularly useful in the preparation of etched copper or zinc halftone plates substituting my alketone compositions for the conventional bichromated glue and shellac used for this purpose. According to the conventional method, a bichromated glue layer on a copper plate is exposed and washed out following which it is "burned in" at about 400° C. during which operation the resist darkens and becomes adherent to the plate. During subsequent etching of the plate in ferric chloride solution, it is necessary to carefully control the amount of undercutting in order to avoid loss of highlight detail, and in order to observe this, periodic scrubbing of the plate is required. This operation adversely affects the characteristics of the plate and distorts the tone reproduction of the halftone image. Following this the resist image is normally removed by scrubbing in a hot concentrated alkali solution. According to the simplified process of my invention, the copper plate is coated with a sensitive mixture of the following composition:

| | | |
|---|---|---|
| Polymethylmethacrylate | grams | 7.25 |
| Difurfuralcyclopentanone | do | .73 |
| Crystal Violet carbinol base | do | .36 |
| Chlorobenzene | cc | 80–100 |
| Toluene | cc | 20–0 |

After drying the coating it is exposed under a halftone image and the resist developed by treating the exposed plate with a mixture of 8–10 parts xylene and 2–0 parts toluene. Other suitable solvents include benzene, chlorobenzene, o- and p-chlorotoluene, di-isopropyl ketone, cyclohexanone and isophorone. The hydrocarbon developer removes the coating in the unexposed region of the plate, following which the plate is etched in 40–46° Bé. ferric chloride solution and the conventional "burning in" step may be omitted. During the etching step the resist remains transparent and the degree of undercutting and side action can be readily observed and scrubbing of the plate to remove overhang may be dispensed with. When the etching is complete, the resist may be removed by washing in a solvent such as acetone. This method of utilizing the sensitive compositions of the invention is illustrated in the drawings according to which is shown exposure of a sensitive element, having a support such as a copper plate 10 carrying the sensitive layer 11 of the invention, to subject 12 having opaque image areas 13, preferably when in vacuum contact. During solvent development the unexposed areas of sensitive layer 11 of the element are removed leaving the support bared in the unexposed areas 14 and the remaining areas 15 of layer 11 constitute a resist. Subsequent etching with, for example, ferric chloride solution removes the support in the unexposed areas 14 and when the resist is removed, a printing plate results having etched image areas 16 in the unexposed areas of the original copper plate support 10.

*Example 2*

Substantial improvement of quality results from electroplating a chromium line or halftone image on copper plates if the conventional bichromated shellac resist is substituted by an alketone photosensitive resist of my invention. A light-sensitive layer is coated on to a copper plate from the following composition:

| | Grams |
|---|---|
| Ethyl Cellulose (approx. 50% ethoxyl content) | 60 |
| Difurfuralcyclopentanone | 6 |
| Crystal Violet carbinol base | 3 |
| Isopropanol | 48 |
| Toluene | 504 |
| Xylene | 216 |
| n-Butanol | 50 |
| Ethyl cellosolve | 120 |

After drying the coating, the plate is printed under a line or halftone image and developed by swabbing in a fatty acid developer of the following composition.

| | Grams |
|---|---|
| Myristic acid | 300 |
| Ligroin (B. P. 90–120° C.) | 1,000 |

The hydrocarbon solution of fatty acid used as a deveoper removes the sensitive layer in the unexposed region. If desired, other fatty acids may be used in place of myristic acid in the developer solution; for example, saturated fatty acids having a straight carbon chain of from 11 to 15 carbon atoms; for example, lauric or palmitic acids and in the latter case of 9% solution in ligroin gives excellent results. After development of the resist image, the plate is degreased, baked and preferably dipped in five per cent nitric acid solution to remove oxide from the surface. The plate is then electroplated for from about two to four minutes at a current density of two ampere per square inch at six to eight volts, the plating bath being maintained at 100 to 105° F. and being composed of a solution of 250 grams of chromic acid and 2.5 grams of sodium sulfate or sulfuric acid per liter. A sheet of lead is used as an anode. Following formation of the bimetallic printing plate, the resist image may be removed with a solvent such as acetone.

In contrast to the conventional bichromated shellac sensitive coatings used in the above and following examples, the alketone coating has an important advantage lying in the fact that its sensitivity is unaffected by storage in the dark and it is not susceptible to changes in atmospheric conditions.

*Example 3*

The light-sensitive alketone compositions of the invention may be used for forming a relief image on a support and etching the support by means of sandblasting. According to the variation of the invention, a support such as a metal or glass plate, is preferably first coated with a friable layer of resin containing a pigment like barytes, then with a thin layer of a water-glass solution followed by a thin layer of natural or synthetic rubber deposited from solvent medium, such as a benzene solution of neoprene. Following this, a dyed solution of an alketone composition; for example, of formula given in Example 2, is coated on to the plate, exposed to a line or halftone image and the resist image developed by treatment in a fatty acid developer solution such as given in Example 2. The plate thus provided with a resist image is then sandblasted with 700 mesh emery powder using a pressure of about 20 pounds per square inch. If the neoprene subcoating is omitted from the above plate, the air pressure used for sandblasting should be of the order of less than 10 pounds per square inch. The cellulose ethyl ether present in the sandblast resist improves the resistance to shock by the sandblast particles.

*Example 4*

The light-sensitive alketone composition of the invention may be used for forming hydrolized cellulose ester printing plates. A sheet of well esterified cellulose acetate or a mixed ester of cellulose such as cellulose acetate propionate is hydrolized with a five per cent solution of sodium hydroxide in 50 per cent ethyl alcohol so as to produce a surface hydrolysis on the sheet to a depth of approximately 0.5 micron. After washing and drying the sheet, a sensitive alketone composition such as provided in Example 2 is coated on the hydrolized surface of the cellulose ester sheet and dried in the usual manner. After exposure of the sensitive layer to a line or halftone image, the element is developed in a fatty acid developer of the type provided above containing myristic acid in petroleum naphtha, then the element is treated so as to remove the stratum of hydrolized cellulose acetate in the region not covered by the alketone resist. This may be accomplished by subjecting the sheet to a sandblast using 500 mesh emery powder and an air pressure of 20 pounds per square inch. After removal of the alketone resist an image of high resolving power is obtained.

It will be apparent from the above examples that the use of alketone sensitized compositions of my invention in place of conventional materials, greatly simplifies photomechanical methods of reproduction of subjects by means of line or half-tone methods. Also, aside from simplicity and increased speed of operation being made available, the invention provides for improvements in quality of reproductions.

My invention having been described I would have it understood that the disclosure herein is by way of example and that I consider as included in my invention all modifications and equivalents falling within the appended claims.

What I claim is:

1. The method of making a photographic relief image which comprises coating a support with a layer of a mixture of a polymeric material selected from a group consisting of cellulose ethyl ether and acrylate resins, and a light-sensitive alketone compound having the general formula:

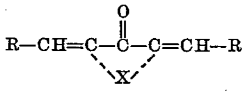

where R represents a member selected from a group consisting of furfuryl, styryl and an aryl group of the benzene series, X represents the atoms necessary to complete a cyclic ring of from five to six carbon atoms, forming a relief image in said layer by exposure to an image and washing away the unexposed area of said layer with a solvent for only said area.

2. The method of making a photographic relief image which comprises coating a metal plate with a layer of a mixture of cellulose ethyl ether and difurfural cyclopentanone, forming a relief image in said layer by exposure to an image and washing away only the unexposed area of said layer, and etching said metal plate with ferric chloric solution in the areas bared by said washing step.

3. The method of making a photographic relief image which comprises coating a rigid support with layers first of water glass, rubber, and then a sensitive layer of a mixture of cellulose ethyl ether and difurfural cyclopentanone, forming a relief image in said sensitive layer by exposure to an image and washing away only the unexposed area of said layer, and subjecting the resultant product to a sandblast to etch said support in the areas bared by said washing step.

4. The method of making a photographic relief image which comprises coating on a prehydrolyzed surface of a cellulose ester support a layer of a mixture of cellulose ethyl ether and difurfural cyclopentanone, forming a relief image in said layer by exposure to an image and washing away only the unexposed area of said layer, and subjecting the resultant product to a sandblast to etch said support in the areas bared by said washing step.

5. The method of making a photographic relief image which comprises coating a support with a layer of a mixture of cellulose ethyl ether and a light-sensitive alketone compound having the general formula:

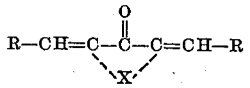

where R represents a member selected from a group consisting of furfuryl, styryl and an aryl group of the benzene series, X represents the atoms necessary to complete a cyclic ring of from five to six carbon atoms, forming a relief image in said layer by exposure to an image and washing away the unexposed area of said layer with a solvent for only said area.

6. The method of making a photographic relief image which comprises coating a support with a layer of a mixture of an acrylate resin and a light-sensitive alketone compound having the general formula:

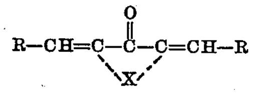

where R represents a member selected from a group consisting of furfuryl, styryl and an aryl group of the benzene series, X represents the atoms necessary to complete a cyclic ring of from five to six carbon atoms, forming a relief image in said layer by exposure to an image and washing away the unexposed area of said layer with a solvent for only said area.

7. The method of making a photographic relief image which comprises coating a support with a layer of a mixture of a polymeric material selected from a group consisting of cellulose ethyl ether and acrylate resins, and a light-sensitive alketone compound having the general formula:

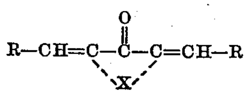

where R represents a member selected from a group consisting of furfuryl, styryl and an aryl group of the benzene series, X represents the atoms necessary to complete a cyclic ring of from five to six carbon atoms, forming a relief image in said layer by exposure to an image and washing away the unexposed area of said layer with a solvent for only said area, and subjecting the resultant product to a sandblast to etch the support in the areas bared by said washing step.

8. The method of making a photographic relief image which comprises coating a metal plate with a layer of a mixture of a cellulose ethyl ether and an alketone compound having the general formula:

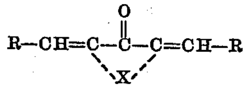

where R represents a member selected from a group consisting of furfuryl, styryl and an aryl group of the benzene series, X represents the atoms necessary to complete a cyclic ring of from five to six carbon atoms, forming a relief image in said layer by exposure to an image and washing away the unexposed area of said layer with a solvent for only said area, and etching said metal plate in the areas bared by said washing step.

WERTER P. VAN DEUSEN.

No references cited.